United States Patent
Primack et al.

(10) Patent No.: US 10,502,774 B2
(45) Date of Patent: Dec. 10, 2019

(54) SYSTEM FOR DETECTING ELECTROMAGNETIC DISCHARGE FIELDS

(71) Applicant: PDP-TECHNOLOGIES LTD, Askelon (IL)

(72) Inventors: Harel Primack, Rishon le Zion (IL); Moti Primack, Petach Tikva (IL)

(*) Notice: Subject to any disclaimer, the term of this patent is extended or adjusted under 35 U.S.C. 154(b) by 0 days.

(21) Appl. No.: 15/561,458

(22) PCT Filed: Mar. 13, 2016

(86) PCT No.: PCT/IL2016/050267
§ 371 (c)(1),
(2) Date: Sep. 25, 2017

(87) PCT Pub. No.: WO2016/151572
PCT Pub. Date: Sep. 29, 2016

(65) Prior Publication Data
US 2018/0252759 A1  Sep. 6, 2018

Related U.S. Application Data

(60) Provisional application No. 62/137,839, filed on Mar. 25, 2015.

(51) Int. Cl.
*G01R 31/08* (2006.01)
*G01R 31/14* (2006.01)
*G01S 5/06* (2006.01)

(52) U.S. Cl.
CPC ............ *G01R 31/08* (2013.01); *G01R 31/14* (2013.01); *G01S 5/06* (2013.01)

(58) Field of Classification Search
CPC .... G01R 31/024; G01R 31/025; G01R 31/08; G01R 31/12; G01R 31/1272; G01R 31/02; G01R 31/027; G01R 31/1254; G01R 31/1227; G01R 31/14; G01R 31/343; G01R 31/346; G01S 5/06
USPC ....... 324/512, 534, 535, 536, 544, 520, 537, 324/547, 501, 522, 551; 702/58, 59
See application file for complete search history.

(56) References Cited

U.S. PATENT DOCUMENTS

| | | | |
|---|---|---|---|
| 6,317,602 B1 * | 11/2001 | Wesby | G01S 5/0221 342/465 |
| 7,579,843 B2 * | 8/2009 | Younsi | G01R 31/1227 324/458 |
| 2004/0263179 A1 | 12/2004 | Ahmed et al. | |
| 2005/0194979 A1 | 9/2005 | Roman et al. | |

(Continued)

FOREIGN PATENT DOCUMENTS

| | | |
|---|---|---|
| WO | 2011151480 A2 | 12/2011 |
| WO | 2014053187 A1 | 4/2014 |

OTHER PUBLICATIONS

International Search Report, dated Aug. 5, 2016 for International Application No. PCT/IL2016/050267.

(Continued)

*Primary Examiner* — Steven L Yeninas
(74) *Attorney, Agent, or Firm* — Smith Tempel Blaha LLC; Gregory Scott Smith

(57) ABSTRACT

A system and method that provide a means to overcome errors in determining the source of an electromagnetic event due to reflection, absorption and scattering of the electromagnetic field due to metallic parts of the electric equipment.

10 Claims, 4 Drawing Sheets

(56) References Cited

U.S. PATENT DOCUMENTS

| | | | |
|---|---|---|---|
| 2006/0164099 A1* | 7/2006 | Steennis | H04B 3/56 |
| | | | 324/536 |
| 2009/0119035 A1* | 5/2009 | Younsi | G01R 31/1227 |
| | | | 702/58 |
| 2009/0177420 A1 | 7/2009 | Fournier et al. | |
| 2011/0156720 A1 | 6/2011 | Di Stefano et al. | |
| 2014/0172327 A1* | 6/2014 | Zhou | G01R 31/027 |
| | | | 702/58 |
| 2014/0324367 A1 | 10/2014 | Garvey, III et al. | |
| 2015/0120218 A1 | 4/2015 | Garnacho Vecino et al. | |
| 2015/0160284 A1* | 6/2015 | Cern | G01R 31/12 |
| | | | 324/536 |
| 2015/0260777 A1* | 9/2015 | Di Stefano | G01R 31/1272 |
| | | | 324/536 |
| 2016/0018459 A1* | 1/2016 | Ohtsuka | G01R 31/025 |
| | | | 324/754.21 |
| 2016/0169958 A1* | 6/2016 | Ohtsuka | G01R 31/001 |
| | | | 324/501 |

OTHER PUBLICATIONS

Written Opinion of the International Searching Authority, dated Aug. 5, 2016 for International Application No. PCT/IL2016/050267.

Moore P.J., Portugues I., Glover I.A., "A nonintrusive partial discharge measurement system based on RF technology" Power Engineering Society General Meeting, 2003, IEEE (vol. 2 ).

Moore P.J., Portugues I., Glover I.A., "Partial Discharge Investigation of a Power Transformer Using Wireless Wideband Radio-frequency Measurements." IEEE Transactions on Power Delivery. vol. 21. 2006. pp. 528-530.

Moore P.J., Portugues I., Glover I.A., "RF based discharge early warning system for air-insulated substations." IEEE Transactions on Power Delivery. vol. 24. 2009. pp. 20-29.

\* cited by examiner

SYSTEM FOR DETECTING ELECTROMAGNETIC DISCHARGE FIELDS

TECHNOLOGY FIELD

The present system and method relate to the field of mapping the location of the source of electric and electromagnetic discharges in electric equipment and electric transmission lines.

BACKGROUND

Partial Discharge (PD) phenomena are defined by IEC 60270 as localized dielectric breakdowns of a small portion of a solid or liquid electrical insulation system under high voltage (HV) stress. PD can occur, for example, in voids within solid insulation, across the surface of insulating material due to contaminants, voids or irregularities in the insulating material, within gas bubbles in liquid insulation, from metal debris in the insulating material, or around an electrode in gas (corona activity). PD causes the insulation to deteriorate progressively and can lead to electrical breakdown. The ultimate failure of HV assets due to electrical breakdown is often sudden, catastrophic and resulting in major damage and network outages.

Periodic PD off-line spot testing of the HV equipment in Electrical Substations (ES) has been used to provide a long term trending of PD activity. However, these spot tests can sometimes fail to identify failures due to changing conditions, which are related to electrical loads, environmental conditions such as temperature or humidity, or conditions related to equipment duty cycle, or seasonal related insulation problems.

In contrast to off-line testing, on-line PD testing and monitoring gives an accurate picture of the health and performance of the HV equipment in the ES, under normal service conditions including the effect of load, temperature and humidity.

The continuous monitoring of PD activity in HV equipment is now accepted as an effective method to identify trends of localized damage or insulation degradation in HV equipment before failure. The occurrence of PD is detectable as one or more of the following phenomena:

(a) Electromagnetic emissions, in the form of short pulses of current and radio waves emission, light and heat.

(b) Acoustic emissions, in the audible and ultrasonic ranges.

(c) Ozone, Nitrous Oxide and other gases emitted either to the air or dissolved in the insulating liquid.

PD events can be detected by various types of sensors which can be placed in, on, or in the vicinity of HV equipment. These sensors include:

(a) a high frequency current transducer (HFCT) sensor, which is clamped around the case of the component being tested and connected to the ground;

(b) ultra-High Frequency (UHF) internal sensor, which measures PD activity in the form of pulses of UHF radio waves;

(c) transient Earth Voltage (TEV) sensor, which measures induced voltage spikes on the surface of the metal surrounding the HV component;

(d) ultrasonic (US) sensor which measures the wide band sound waves created by the mechanical shock wave associated with the PD event. Ultrasonic sensors can be positioned in the interior or the exterior of the component under examination; and (e) chemical sensors can detect the breakdown of HV equipment material into its chemical components due to a PD event. The two primary chemical tests employed are Dissolved Gas Analysis (DGA), and High Performance Liquid Chromatography (HPLC).

The sensors for PD detection described above require multiple connections to the HV equipment. All the technologies require at least one sensor per HV component and some of the sensors are required to be internally located in the HV equipment (see "Recent trends in the condition monitoring of transformers: Theory implementation and analysis" by: Sivaji Chakravorti; Debangshu Dey; Biswendu Chatterjee London: Springer, 2013). An alternative approach, which does not require internal placement of sensors, is a noncontact, remote-sensing technology, such as the detection of radio-frequency (RF) radiation emissions emitted during a PD event (see Moore P. J., Portugues I., Glover I. A., "A nonintrusive partial discharge measurement system based on RF technology" Power Engineering Society General Meeting, 2003, IEEE (Volume: 2)).

The RF radiation from a PD event consists of several individual high-energy, wideband pulses ranging in length from a few nanoseconds to a few microseconds. The RF radiation occurs because once a discharge is initiated, the electrons, which comprise the current of the HV equipment, are quickly depleted in the created gap, either by striking the point electrode or by attachment to gas-phase molecules. The rise time of the resulting PD pulse is sufficiently fast to extend into the RF spectrum and cause the electrically attached, supporting structures such as bus-bars, bushings, etc. to emit the impulse response RF radiation. The resulting pulses are localized, and depending on the pulses magnitude, can be readily measured within typical distances of 100 to 200 meters. The pulses of the RF radiation may be detected by a continuous RF monitoring system in the range of 500-2500 MHz comprised of an antenna array and RF receivers which are located within the ES.

The ES environment is particularly onerous for RF radiation detection. RF noise, which includes RF pulses, is generated by a wide range of energized equipment which contains stressed insulation. The main challenge of an RF based PD sensing system is to distinguish between RF noise, like operating switchgear, circuit breakers and voltage switches, and PD phenomena (see Moore P. J., Portugues I., Glover I. A., "Partial Discharge Investigation of a Power Transformer Using Wireless Wideband Radio-frequency Measurements." *IEEE Transactions on Power Delivery*. Vol. 21. 2006. pp. 528-530). In RF detection of the PD signal, the localization of the faulted HV element within the ES is essential. Previous work treated the localization problem as free space localization and employed standard triangulation methods (see Moore P. J., Portugues I., Glover I. A., "RF based discharge early warning system for air-insulated substations." *IEEE Transactions on Power Delivery*. Vol. 24. 2009. pp 20-29). In this work, errors in the range of several meters have been reported. Since the area of the Electrical substation (ES) contains a large amount of high power and high voltage electrical equipment, the area is saturated with a wideband electromagnetic noise. The wideband electromagnetic noise reduces the Signal to Noise Ratio (SNR), and obscures the detection of PD signals, which results in the large location errors.

In addition to the electromagnetic noise, the PD signal can be reflected, attenuated, scattered, and absorbed by the different metallic structures of the high voltage equipment.

The distortions in the PD signal and the environmental ES's electromagnetic noise hinder the detection and localization of the PD source.

An additional approach to PD detection is described in U.S. Pat. No. 7,467,049. Hence a system and method for improving the localization accuracy and detection SNR by overcoming the electromagnetic noises and the distortions in the PD signal due to high power and high voltage equipment is required.

Glossary

High Voltage Equipment—as used in the current disclosure, is equipment used in the generation, transmission, measurement, control, switching, storage, and distribution of electric power at voltages above 30 KV and up to 1200 KV Electrical Substation—as used in the current disclosure, means an area or several non-contingent areas containing high voltage equipment.

Partial Discharge—as used in the current disclosure, means an electrical discharge or arc emanating from within high voltage equipment.

Receivers—as used in the current disclosure, means an electronic devices used for the detection of electromagnetic events.

Common time base—as used in the current disclosure, is a means to have all receivers register their electromagnetic events using the same time reference.

Common processing platform—as used in the current disclosure, means a device which aggregates all the electromagnetic events from the receivers and processes them according to the algorithms defined in the disclosure.

Antenna—as used in the current disclosure, means an element for converting electromagnetic events into electrical signals.

Analog unit—as used in the current disclosure, means an element or elements for amplifying, filtering and conditioning the electrical RF signal from the antenna.

Signal processing unit—as used in the current disclosure, means a device for converting the electrical signal from the Analog unit to a digital signal and processing the digital signal according to the algorithms described in the disclosure.

Communication unit—as used in the current disclosure, means a device which connects the receiver to the common processing unit.

Data unit—as used in the current disclosure, means a device which contains data relating to the operation of the receiver.

Receiver unit—is comprised of the analog unit, the signal processing unit, data unit and the communication unit.

Representation—as used in the current disclosure, means a set of data corresponding and derived from a digital signal, for example, if the digital signal contains a pulse, a representation of the signal can be the time stamp, as defined by the common time base, of the pulse edge and the pulse shape.

Time stamp—as used in the current disclosure, means a number which indicates the point in time when an EM event has been detected.

Time of Arrival (ToA) list—as used in the current disclosure, means a list of ToA's calculated from the time stamp. The list contains time stamps related to a number of HV components as received by one of the antennas.

Time of Arrival (ToA) matrix—as used in the current disclosure, means a matrix of ToA lists where each ToA list is associated with a unique antenna.

SUMMARY OF THE DISCLOSURE

The present document discloses a system and method for detecting partial discharge (PD) events that includes a common time base; three or more receivers for receiving PD events, wherein said receivers receive electromagnetic signals and generate a time synchronized digital signals corresponding to said electromagnetic events and said common time base; a common processing platform; communication units connecting the receivers to the common processing platform; and wherein the receivers process the time synchronized digital signal to obtain a representation of the time synchronized digital signal and transmit via the communication unit the representation of the time synchronized digital signal to the common processing platform and the common processing platform detects an PD event when three or more representations correlate to a PD event within a defined location.

DESCRIPTION

Figure 1:
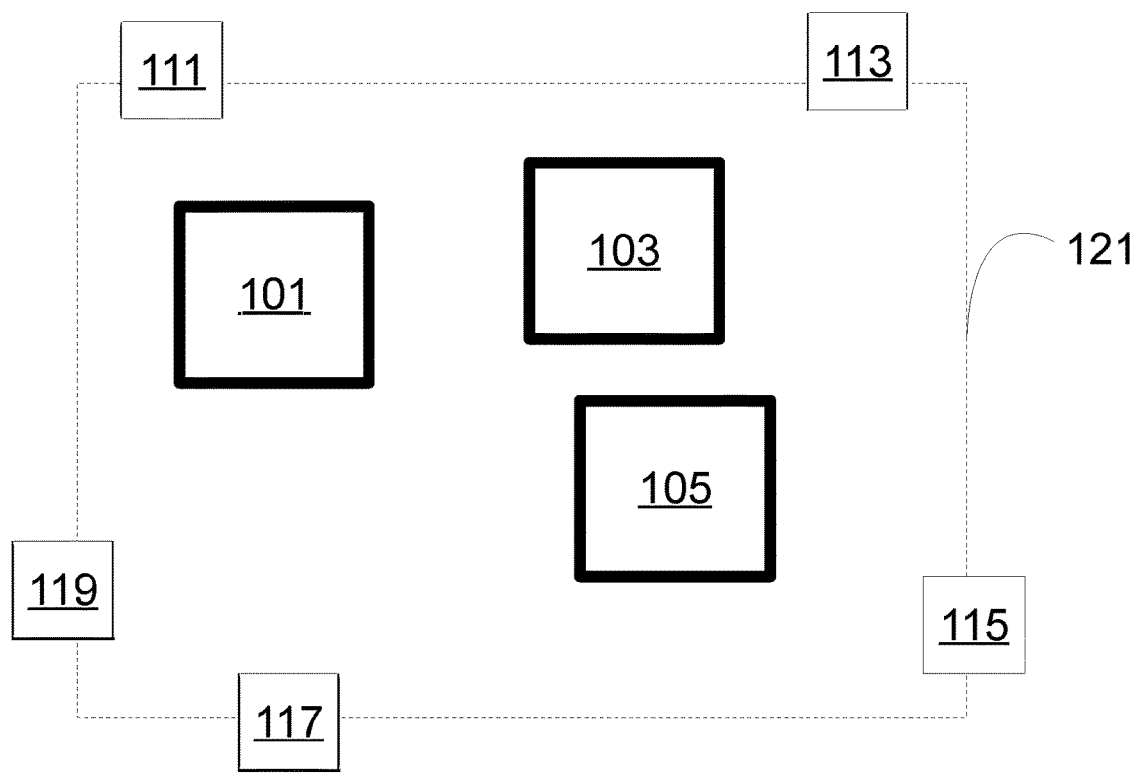
FIG. 1 is an example of an electrical substation with high voltage equipment and receivers for detecting PD events.

FIG. 1 is an example of an electrical substation (121) with high voltage equipment (101, 103, 105) and receivers (111, 113, 115, 117) for detecting PD events. In one example the electrical substation (121) can be an enclosed area containing the high voltage equipment (101, 103, 105). The substation area can range from ten square meters to a few hundred square meters. In another example, the electrical substation can be several, non-contingent areas. In still another example, the electrical substation area (121) can include one or more towers containing high voltage equipment (101, 103, 105). Examples of high voltage equipment include various types of power transformers, switches, switch gears, circuit breakers, shunt capacitors, filters, and reactors. In one example, the receivers (111, 113, 115, 117) are designed to detect electromagnetic radiation which is typical of PD events. The receivers also detect electromagnetic noise. By using suitable electronic analog and digital filters the receivers (111, 113,115, 117) can enhance the PD detected power over the electromagnetic noise. In one example, the receivers (111,113, 115, 117) share a common time base. In one example the time base is a local time synchronized to a common source. In another example, the time base is an accurate clock such as an atomic clock. In another example, the common time base is generated by satellite navigation or communication system, such as GPS system. In another example, the time base is a common time base to all receivers (111, 113, 115, 117). The receivers send the received signal to a common processing platform (119). The time base is maintained by the common processing platform (119). The common processing platform can be an external system (119) or an element in one of the receivers (e.g. 111).

Figure 2:
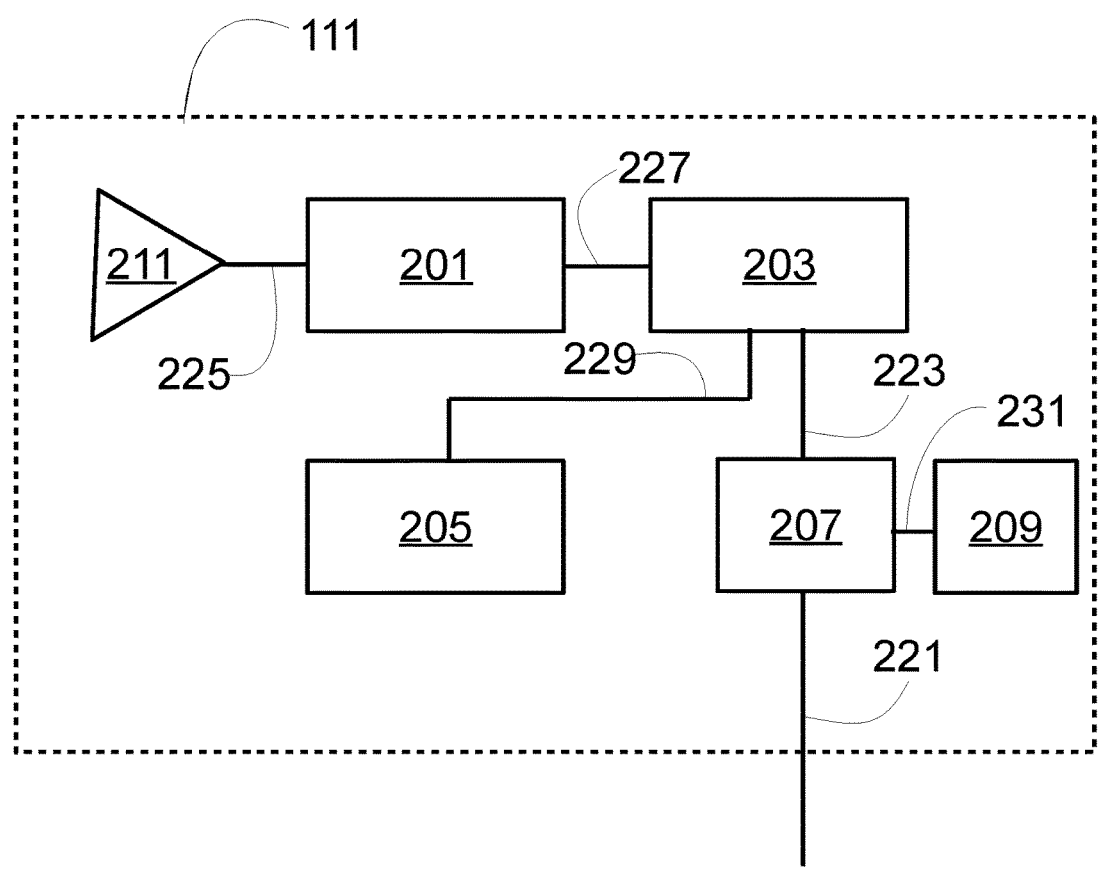
FIG. 2 is an example of the present receiver for detecting PD events.

FIG. 2 is an example of a receiver (111) for detecting PD events. The receiver includes an antenna (211), an analog unit (201), a signal processing unit (203), data unit (205) and a communication unit (207). Examples of antenna include omnidirectional antenna, such as whip, bi-conical antenna, or dipole antenna, and directional antenna such as horn, parabolic, Yagi, fractal or phased array. The antenna (211) is designed to receive electromagnetic signals including PD signals. A PD signal is typically a very narrow pulse with a corresponding ultra-wide band (UWB) spectrum signal in the frequency domain. These pulses may be as narrow as 0.5-2 nanoseconds with rise/fall time in the order of few tenths of nanoseconds. To detect such pulses with high fidelity, i.e., to be able to reconstruct the pulse shape, the antenna (211) has to have a bandwidth of a few GHz and linear phase delay throughout the entire relevant spectrum. The antenna (211) converts the electromagnetic signal to an RF signal, which is transferred via RF line (225) to the analog unit (201). In one example, the analog unit (201) filters and amplifies the RF signal to enhance the PD signal to electromagnetic noise ratio and samples the RF signal to obtain a digital signal. The digital signal is processed by signal processing unit (203). In one example, the resulting digital signal is deformed due to the reflections, attenuation, scattering, and absorption of the metallic structures of the high voltage equipment (101, 103, 105 in FIG. 1). The signal processing unit (203) processes the digital signal according to the calibration data from the data unit (205). The processed digital signal is sent via the communication unit (207) to common processing platform (119 in FIG. 1). The receiver (111) requires a common time base for recording the time stamp and calculating the ToAs from the PD source to the multiple receivers (111, 113, 115, 117 in FIG. 1). In one example the common time base is provided by an accurate clock (209). In another example the accurate clock can be an atomic clock. In another example the accurate clock (209) can be embedded in the communication unit (207). In another example the clock is generated by the common processing platform (119 in FIG. 1) and distributed to the receiver (111) by the communication channel (221). In another example each source—receiver pair is synchronized to a common time base for the purpose of ToA measurements. The measurements may take place in parallel if all the pairs are synchronized simultaneously or in series if only one pair is synchronized at a time.

Figure 3:
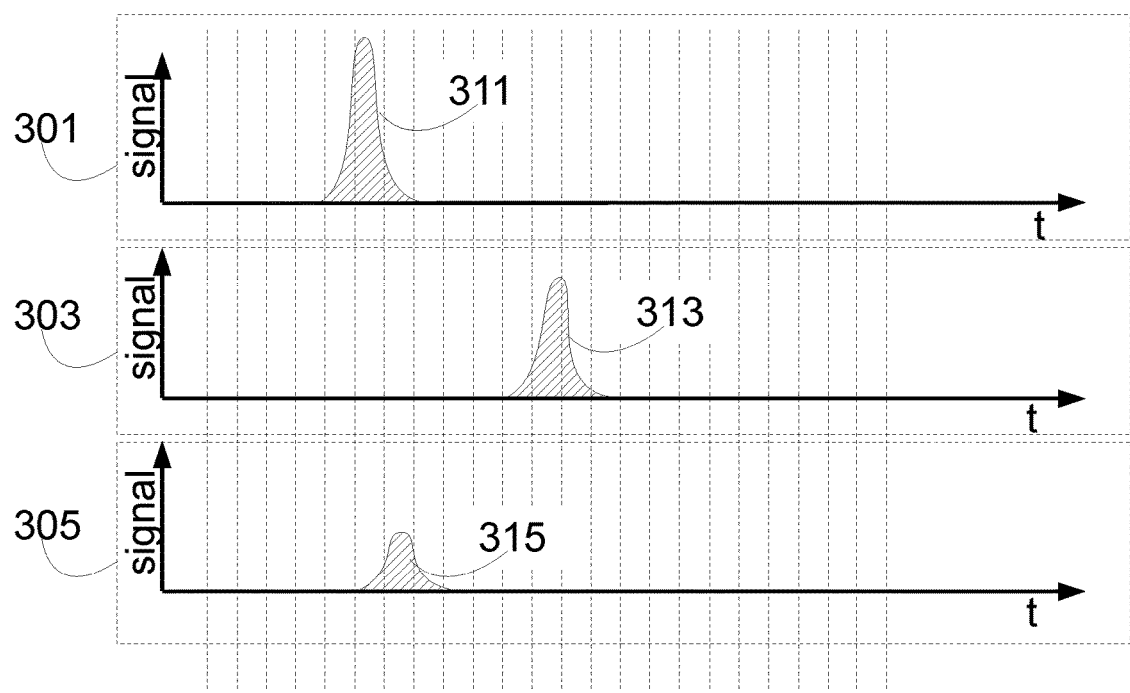
FIG. 3 depicts several examples of the electrical signal resulting from a common electromagnetic event which is detected by several receivers.

FIG. 3 depicts several examples (301, 303, 305) of the electrical signal (311, 313, 315) resulting from a common electromagnetic event which is detected by several receivers (e.g., 111, 113, 115, 117 in FIG. 1). In one example, the receivers share a common time base and all timings in the receivers are synchronized. This is depicted in FIG. 3 by the dashed vertical lines. Each vertical line denotes a common time base shared between the receivers. Graph (301) is the electrical signal from receiver (111 in FIG. 1), graph (303) is the electrical signal from receiver (113 in FIG. 1), and graph (305) is the electrical signal from receiver (115 in FIG. 1). In this example an electromagnetic event is received by the receivers (111, 113, 115 in FIG. 1) and the resulting electrical signal in each receiver is given by (311, 313, 315) respectively. Due to the common time base, the timing differences of the electrical signal as received by the receivers can be used to find the distance of the electromagnetic event from each of the receivers (111, 113, 115 in FIG. 1). In one example, the time stamp differences plus a constant provides the ToA from source to antenna array. The three ToA multiplied by the speed of the transmission of the electromagnetic event provide three distances. Each distance is attributed to the receiver (111, 113, 115 in FIG. 1) in which the signal was generated and the intersection of the three distances provides the location of the electromagnetic event. In another example, the electromagnetic event may undergo reflection, dispersion, attenuation, and other deformations as a result of the interaction of the electromagnetic wave with the high voltage equipment or other equipment, or electrically conducting elements. In another example the calibration data is stored in the central processing unit (119 in FIG. 1). In another example, the receiver (111, 113, 115, 117 in FIG. 1) includes a data unit (205 in FIG. 2) which contains calibration data including ToA list. The signal processing unit (203 in FIG. 2), in the receiver (e.g., 111, 113, 115 in FIG. 1) applies the calibration data to the digital signal to remove the effects of the interfering conductors.

Figure 4:
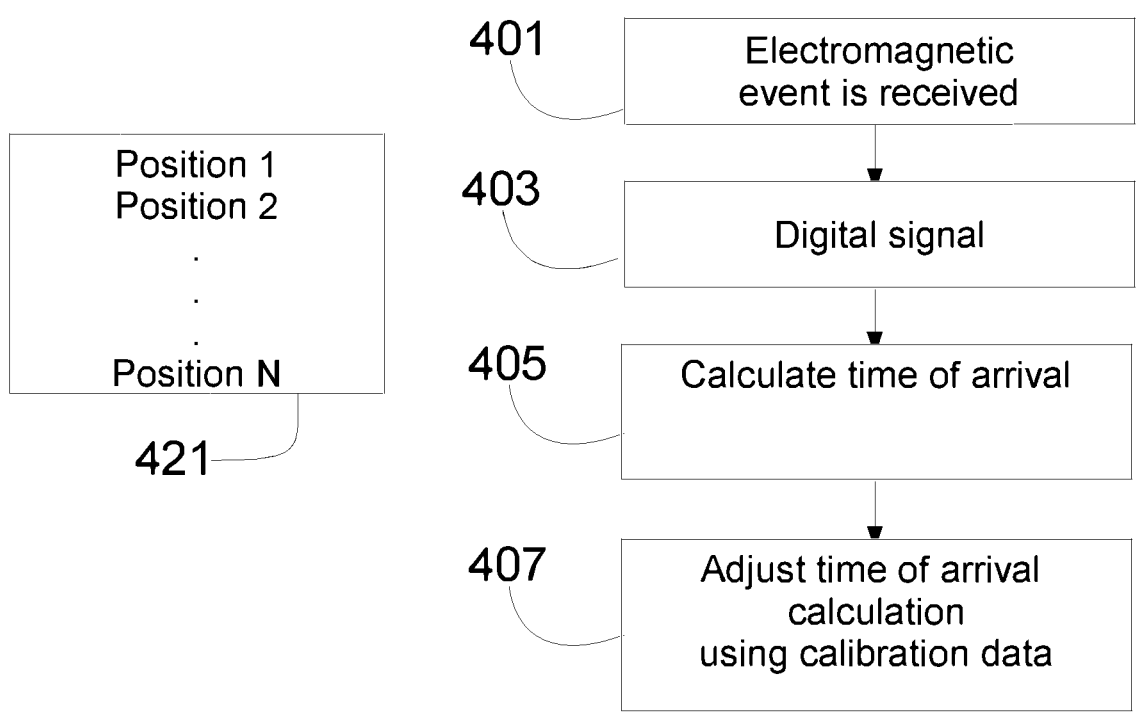
FIG. 4 is an example of an instruction flow for finding the location of an electromagnetic event.

FIG. 4 is an example of an instruction flow for finding the location of an electromagnetic event. Table (421) contains calibration data. In one example the calibration data is a matrix containing actual and measured ToA's. In another example, the calibration data is a matrix containing actual distance and a trace of corresponding calibration electric signal. The instruction flow described in FIG. 4 corresponds to calibration data which contains actual distance and a trace of corresponding calibration electric signal. Other examples of calibration data may have different instruction flows.

Block 401 describes the required action for receiving the electromagnetic event at the receiver (111 in FIG. 3) and the antenna (211 in FIG. 2). Block 403 describes the functions required to generate a digital signal from the electromagnetic event, these functions include filtering the received signal, and sampling the electrical signal by means of an Analog to Digital convertor. The receiver will transfer the digital signals to the common processing platform via the communication unit (207 in FIG. 2).

In Block 405, the common processing platform will compare the actual signals obtained from multiple receivers and determine if all the actual signals correspond to a single common location in the electric substation. If the common processing platform cannot identify a common location up to a pre-determined common location error, for the actual signals provided by the receivers, then the common processing platform determines that no electromagnetic event has occurred in the electric substation. The rejection of electromagnetic signals which don't show a common electromagnetic source location is enabled by the accurate electromagnetic mapping of the substation. Hence the electromagnetic mapping reduces the PD false detection probability. It also increases the SNR for an actual PD event within the ES. The correlated ToA or common location is only a necessary condition but not sufficient condition for PD event indication. A signal analysis of the electromagnetic pulse shape and the pulse sequence has to be carried out and if the pulses fulfil certain criteria than the sequence will be detected as a valid PD event within the ES.

Another utilization of the accurate electromagnetic mapping and the ToA matrix is the detection of PD event in a very noisy electromagnetic environment where the SNR is close to one. In such an environment it is preferred to avoid false detection by raising the PD pulse detection threshold. Under such conditions there may be a situation where only one or two receivers will exceed the threshold and detect the PD pulse. However, two receivers are not sufficient to determine the electromagnetic source location. One example of a resolution to this problem is to align the rest of the signals detected by the receivers to a common time window relative to the receiver or receivers that detected the PD pulse. The resulting M×N matrix of signals from the M HV components to the N receivers array according to the M×N ToA matrix can be averaged over the receiver index to enhance the SNR. For each of the HV components the signals from all the receivers are accumulated. Since the PD signal is correlated across the receivers while the background noise is not correlated, a significant signal enhancement by the accumulation is an indication of a potential PD source from that HV component.

To sum, in one example we present a system for detecting PD events comprising; a common time base; three or more receivers for receiving PD events, wherein the receivers receive electromagnetic events and generate a time synchronized digital signal corresponding to said electromagnetic events; a common processing platform; a communication unit connecting the receivers to the common processing platform; wherein the receivers process the time synchronized digital signal to obtain a representation of the time synchronized digital signal and transmit via the communication unit the representation of the time synchronized digital signal to the common processing platform and the common processing platform detects an PD event when three or more representation correlate to an PD event within a defined location. In an additional example, the receiver for receiving PD events includes a data unit containing calibration data which is used for generating the representation of the time synchronized digital signal. In an additional example the common time base is generated by the common processing platform and shared with the receivers via the communication unit. In an additional example, the communication protocol is one of Ethernet, Wifi, USB, Zigbee, Bluetooth IEC-61850, IEC-60870, DNP3.

In an additional example, we describe a method for detecting PD events comprising; Receiving electromagnetic events in three or more receivers, said receivers sharing a common time base, and generating a corresponding electrical signal; Generating a time synchronized digital signal, by filtering, conditioning and sampling said electrical signal; wherein the receivers process the time synchronized digital signal to obtain a representation of the time synchronized digital signal; transmitting via the communication unit the representation of the time synchronized digital signal to the common processing platform and the common processing platform detects an PD event when two or more representation correlate to an PD event within a defined location.

In an additional example, we describe a method for detecting PD events in low SNR conditions comprising; receiving electromagnetic events in three or more receivers, said receivers sharing a common time base, and generating a corresponding electrical signal; and wherein at least one of the receivers detects an electromagnetic signal which is identified as a PD event; said receiver time stamp is used to trigger a post processing sequence wherein a matrix of digital signals is created from the ToA matrix values; wherein said matrix of signals is accumulated and analyzed for a significant enhancement of the PD event detection in the other receivers, such that the source location of said PD event is detected. In a further example wherein if a significant enhancement of PD detection in the other receivers is found; than a location of the PD event is derived from the PD time stamp in three or more said receivers.

The invention claimed is:

1. A system for detecting partial discharge (PD) events comprising:
a common time base;
three or more electromagnetic antennas, wherein the locations of the three or more electromagnetic antenna define an area of interest for the detection of PD events; and
three or more receivers, wherein each of the three or more receivers are communicatively coupled to a corresponding one of the three or more electromagnetic antennas, wherein each of the three or more electromagnetic antennas receives electromagnetic signals and the receiver communicatively coupled to the electromagnetic antenna generates a time synchronized digital signals corresponding to said received electromagnetic signals and said common time base;
a common processing platform;
a communication unit connecting each of the three or more receivers to the common processing platform; and
wherein each of the three or more receivers further processes the generated time synchronized digital signal to obtain a representation of the generated time synchronized digital signal and transmits, via the communication unit, the representation to the common processing platform where a PD event detection occurs when three or more of the representations are temporarily correlated and correspond to a PD event occurring within the area of interest.

2. The system for detecting PD events according to claim 1, wherein each of the three or more receivers for receiving PD events includes a data unit containing calibration data, which is used for generating the representation.

3. The system for detecting PD events according to claim 1, wherein the common processing platform includes a data unit containing calibration data which is used for generating the representation.

4. The system for detecting PD events according to claim 1, wherein the common time base is generated by the common processing platform and shared with each of the three or more receivers via the communication unit.

5. The system for detecting PD events according to claim 1, wherein the common time base is generated by an atomic clock.

6. The system for detecting PD events according to claim 1, wherein the common time base is generated by satellite navigation or communication system, such as GPS system.

7. The system for detecting PD events according to claim 1, wherein a communication protocol is one of Ethernet, Wifi, USB, Zigbee, Bluetooth IEC-61850, IEC-60870, DNP3.

8. A method for detecting partial discharge (PD) events comprising:
receiving electromagnetic signals in three antennas, each antenna connected to receivers, wherein each receiver generates a digital time synchronized signal, and filters, conditions and samples said digital time synchronized signal;
wherein each receivers processes the time synchronized digital signal to obtain a representation of the time synchronized digital signal; and
transmitting via a communication unit the representation to a common processing platform and the common processing platform detects PD event when three or more of the representations are temporarily correlated and correspond to a PD event occurring within an area of interest.

9. A method for detecting partial discharge (PD) events comprising:
receiving electromagnetic signals in at least three antennas each connected to a receiver, wherein each receiver generates a digital time synchronized signal by converting the electromagnetic signal to an electrical signal, and filtering, conditioning and sampling said electrical signal;

detecting a suspected PD event in the digital time synchronized signal and registering a time stamp corresponding to the time a PD event was detected;

after detecting a suspected PD event, a post processing sequence establishes a matrix of time delayed digital signals wherein the time delay is equal to a time of arrival (ToA) from each receiver; wherein a correlation between the matrix elements indicate the PD event has occurred; in the absence of correlation no PD event has occurred;

and wherein if a PD event has occurred a location of the PD event is derived from ToA of the three or more receivers.

10. The method for detecting PD events according to claim 9, wherein if a significant enhancement of PD detection in the other receivers is found; then a location of the PD event is derived from the PD time stamp in three or more said receivers.

* * * * *